(12) United States Patent
Khlat

(10) Patent No.: US 12,206,364 B2
(45) Date of Patent: Jan. 21, 2025

(54) DELAY-COMPENSATING POWER MANAGEMENT CIRCUIT

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 18/402,102

(22) Filed: Jan. 2, 2024

(65) Prior Publication Data

US 2024/0136979 A1 Apr. 25, 2024

Related U.S. Application Data

(63) Continuation of application No. 17/331,756, filed on May 27, 2021, now Pat. No. 11,929,712.
(Continued)

(51) Int. Cl.
H03F 1/02 (2006.01)
G05F 1/46 (2006.01)
(Continued)

(52) U.S. Cl.
CPC ........... *H03F 1/0222* (2013.01); *G05F 1/461* (2013.01); *H03F 1/32* (2013.01); *H03F 3/195* (2013.01);
(Continued)

(58) Field of Classification Search
CPC .......... H03F 1/0222; H03F 1/32; H03F 3/195; G05F 1/461
See application file for complete search history.

(56) References Cited

U.S. PATENT DOCUMENTS 6,138,042 A * 10/2000 Midya .................. H03F 1/0227
455/571
8,093,945 B2 1/2012 Wimpenny
(Continued)

OTHER PUBLICATIONS

Notice of Allowance for U.S. Appl. No. 17/351,716, mailed May 13, 2024, 8 pages.
(Continued)

Primary Examiner — Patricia T Nguyen
(74) Attorney, Agent, or Firm — Withrow & Terranova, P.L.L.C.

(57) ABSTRACT

A delay-compensating power management circuit is provided. The power management circuit includes a power management integrated circuit (PMIC) configured to generate a time-variant voltage(s) based on a time-variant target voltage(s) for amplifying an analog signal(s) associated with a time-variant power envelope(s). A voltage processing circuit is provided in the power management circuit to determine a temporal offset, which can be positive or negative, between the time-variant power envelope(s) and the time-variant target voltage(s). Accordingly, the voltage processing circuit modifies the time-variant target voltage(s) to substantially reduce the determined temporal offset and thereby realign the time-variant target voltage(s) with the time-variant power envelope(s). By realigning the time variant target voltage(s) with the time-variant power envelope(s), it is possible to align the time-variant voltage(s) with the time-variant power envelope(s) to reduce distortions (e.g., amplitude clipping) during amplification of the analog signal.

20 Claims, 7 Drawing Sheets

Related U.S. Application Data

(60) Provisional application No. 63/064,784, filed on Aug. 12, 2020.

(51) Int. Cl.
  *H03F 1/32* (2006.01)
  *H03F 3/195* (2006.01)
  *H03F 3/24* (2006.01)
  *H04B 1/40* (2015.01)
  *H04L 27/36* (2006.01)

(52) U.S. Cl.
  CPC ............... *H03F 3/24* (2013.01); *H04B 1/40* (2013.01); *H04L 27/366* (2013.01); *H03F 2200/102* (2013.01); *H03F 2200/336* (2013.01); *H03F 2200/451* (2013.01); *H03F 2200/511* (2013.01)

(56) References Cited

U.S. PATENT DOCUMENTS

| | | | |
|---|---|---|---|
| 8,159,309 | B1 | 4/2012 | Khlat et al. |
| 9,002,303 | B2 | 4/2015 | Brobston |
| 9,093,960 | B2 * | 7/2015 | McCallister ............ H04B 1/62 |
| 9,923,520 | B1 | 3/2018 | Abdelfattah et al. |
| 10,090,808 | B1 * | 10/2018 | Henzler ............... H03F 1/0216 |
| 10,158,329 | B1 | 12/2018 | Khlat |
| 10,530,305 | B2 | 1/2020 | Folkmann et al. |
| 10,622,948 | B2 | 4/2020 | Khlat |
| 10,680,559 | B2 | 6/2020 | Khlat et al. |
| 10,911,001 | B2 | 2/2021 | Khlat et al. |
| 11,677,365 | B2 | 6/2023 | Khlat |
| 11,923,806 | B2 | 3/2024 | Khlat |
| 11,923,812 | B2 | 3/2024 | Khlat |
| 11,929,712 | B2 | 3/2024 | Khlat |
| 2007/0249304 | A1 | 10/2007 | Snelgrove et al. |
| 2012/0039487 | A1 | 2/2012 | Sakai |
| 2012/0302179 | A1 | 11/2012 | Brobston et al. |
| 2013/0076418 | A1 | 3/2013 | Belitzer et al. |
| 2014/0199949 | A1 | 7/2014 | Nagode et al. |
| 2014/0213196 | A1 | 7/2014 | Langer et al. |
| 2014/0266423 | A1 | 9/2014 | Drogi et al. |
| 2014/0361837 | A1 | 12/2014 | Strange et al. |
| 2016/0164550 | A1 | 6/2016 | Pilgram |
| 2016/0182100 | A1 | 6/2016 | Menkhoff et al. |
| 2016/0249300 | A1 | 8/2016 | Tsai et al. |
| 2016/0277045 | A1 | 9/2016 | Langer |
| 2017/0359784 | A1 | 12/2017 | Kumar et al. |
| 2018/0241347 | A1 * | 8/2018 | Petrovic ............... H04B 1/0475 |
| 2018/0358942 | A1 | 12/2018 | Hurwitz |
| 2019/0215023 | A1 | 7/2019 | Abouelenin |
| 2020/0036338 | A1 | 1/2020 | Gorisse et al. |
| 2021/0067097 | A1 | 3/2021 | Wang et al. |
| 2021/0194522 | A1 | 6/2021 | Stockert et al. |
| 2022/0052647 | A1 | 2/2022 | Khlat et al. |
| 2022/0052648 | A1 | 2/2022 | Khlat |
| 2022/0052649 | A1 | 2/2022 | Retz et al. |
| 2022/0052651 | A1 | 2/2022 | Khlat |
| 2022/0115987 | A1 | 4/2022 | Granger-Jones |
| 2022/0115988 | A1 | 4/2022 | Khlat et al. |
| 2022/0116029 | A1 | 4/2022 | Khlat et al. |
| 2022/0360229 | A1 | 11/2022 | Khlat |
| 2023/0122151 | A1 | 4/2023 | He et al. |

OTHER PUBLICATIONS

Notice of Allowance for U.S. Appl. No. 17/331,739, mailed Oct. 24, 2023, 7 pages.
Notice of Allowance for U.S. Appl. No. 17/331,756, mailed Oct. 25, 2023, 8 pages.
Notice of Allowance for U.S. Appl. No. 17/351,667, mailed Oct. 4, 2023, 8 pages.
Notice of Allowance for U.S. Appl. No. 17/351,695, mailed Nov. 13, 2023, 8 pages.
Non-Final Office Action for U.S. Appl. No. 17/351,716, mailed Dec. 6, 2023, 7 pages.
Notice of Allowance for U.S. Appl. No. 17/351,768, mailed Oct. 20, 2023, 7 pages.
Wan et al. "Negative Group Delay Theory of a Four-Port RC-Network Feedback Operational Amplifier" IEEE Access, vol. 7, 2019, pp. 75708-75720.
Notice of Allowance for U.S. Appl. No. 17/351,744, mailed Jan. 4, 2024, 7 pages.
Non-Final Office Action for U.S. Appl. No. 18/609,671, mailed Oct. 24, 2024, 6 pages.

* cited by examiner

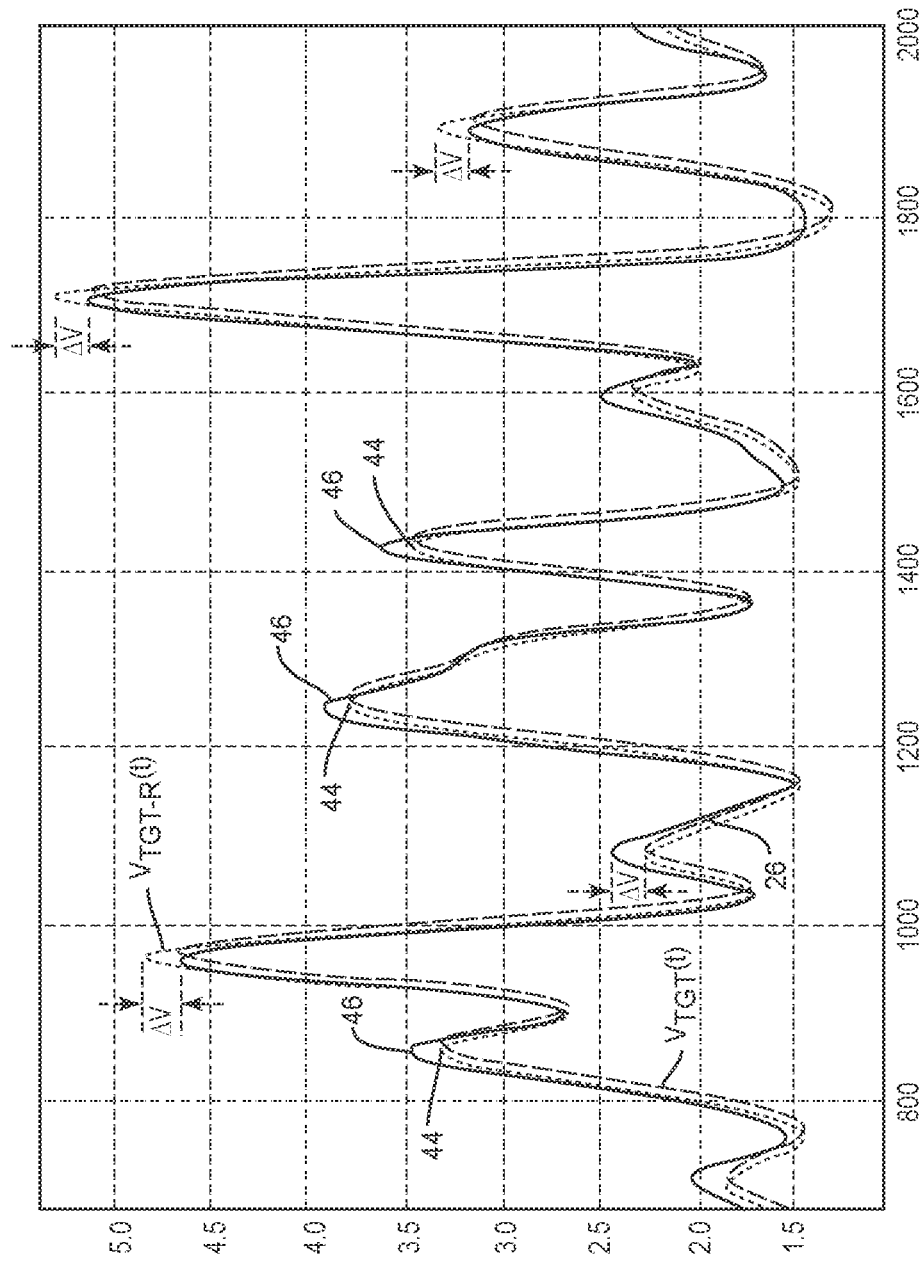

DELAY-COMPENSATING POWER MANAGEMENT CIRCUIT

RELATED APPLICATIONS

This application is a continuation of U.S. patent application Ser. No. 17/331,756, now U.S. Pat. No. 11,929,712, which claims the benefit of U.S. Provisional Patent Application Ser. No. 63/064,784, filed on Aug. 12, 2020, the disclosures of which are hereby incorporated herein by reference in their entireties.

FIELD OF THE DISCLOSURE

The technology of the disclosure relates generally to a power management circuit capable of compensating delays between two time-variant inputs.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

A modern wireless communication device typically includes a transceiver circuit(s), a power amplifier(s), and a power management circuit(s). The transceiver circuit is configured to generate a radio frequency (RF) signal(s) for communicating a variety of data payloads, the power amplifier(s) is configured to amplify the RF signal(s) to a desired power level before transmission based on a supply voltage (s), and the power management circuit(s) is configured to provide the supply voltage(s) to the power amplifier(s).

Notably, the RF signal(s) as generated by the transceiver circuit(s) is typically associated with a time-variant power envelope that rises and falls over time. In this regard, to avoid potential amplitude clipping at the power amplifier(s), the power management circuit must generate the supply voltage to closely track the time-variant power envelope of the RF signal(s). In other words, the supply voltage must be time-aligned with the time-variant power envelope. As such, the transceiver circuit(s) may be further configured to provide the power management circuit with a time-variant target voltage that is time-aligned with the time-variant power envelope, and the power management circuit is thus configured to generate the supply voltage based on the time-variant target voltage. Ideally, since the time-variant target voltage is time-aligned with the time-variant power envelope, the supply voltage should also be time-aligned with the time-variant power envelope.

However, the transceiver circuit is typically a separate circuit from the power management circuit and coupled to the power management circuit via a communication bus(es). Depending on how the transceiver circuit is configured to send the RF signal(s) and the time-variant target voltage to the power management circuit(s), the time-variant target voltage may become misaligned from the time-variant power envelope of the RF signal(s) when arrived at the power management circuit(s). As such, it is desirable for the power management circuit to be able to realign the time-variant target voltage and the time-variant power envelope.

SUMMARY

Aspects disclosed in the detailed description include a delay-compensating power management circuit. The power management circuit includes a power management integrated circuit (PMIC) configured to generate a time-variant voltage(s) based on a time-variant target voltage(s) for amplifying an analog signal(s) associated with a time-variant power envelope(s). A voltage processing circuit is provided in the power management circuit to determine a temporal offset, which can be positive or negative, between the time-variant power envelope(s) and the time-variant target voltage(s). Accordingly, the voltage processing circuit modifies the time-variant target voltage(s) to substantially reduce the determined temporal offset and thereby realign the time-variant target voltage(s) with the time-variant power envelope(s). By realigning the time variant target voltage(s) with the time-variant power envelope(s), it is possible to align the time-variant voltage(s) with the time-variant power envelope(s) to reduce distortions (e.g., amplitude clipping) during amplification of the analog signal.

In one aspect, a method for compensating delay in a power management circuit is provided. The method includes determining a temporal offset between a time-variant power envelope of an analog signal and a time-variant target voltage corresponding to the time-variant power envelope. The method also includes generating a time-variant modified target voltage that is time-adjusted relative to the time-variant power envelope to thereby substantially reduce the determined temporal offset between the time-variant target voltage and the time-variant power envelope. The method also includes generating a time-variant voltage based on the time-variant modified target voltage for amplifying the analog signal.

In another aspect, a wireless device is provided. The wireless device includes a transceiver circuit configured to generate a time-variant power envelope of an analog signal and a time-variant target voltage corresponding to the time-variant power envelope. The wireless device also includes a power management circuit. The power management circuit includes a voltage processing circuit. The voltage processing circuit is configured to determine a temporal offset between the time-variant power envelope and the time-variant target voltage. The voltage processing circuit is also configured to generate a time-variant modified target voltage that is time-adjusted relative to the time-variant power envelope to thereby substantially reduce the determined temporal offset between the time-variant target voltage and the time-variant power envelope. The power management circuit also includes a PMIC. The PMIC is configured to generate a time-variant voltage based on the time-variant modified target voltage. The wireless device also includes a power amplifier configured to amplify the analog signal based on the time-variant voltage.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

FIG. 4 is a graphic diagram providing an exemplary illustration of a voltage headroom between the time-variant modified target voltage and the time-variant power envelope of FIG. 3.

DETAILED DESCRIPTION

Figure 1A:
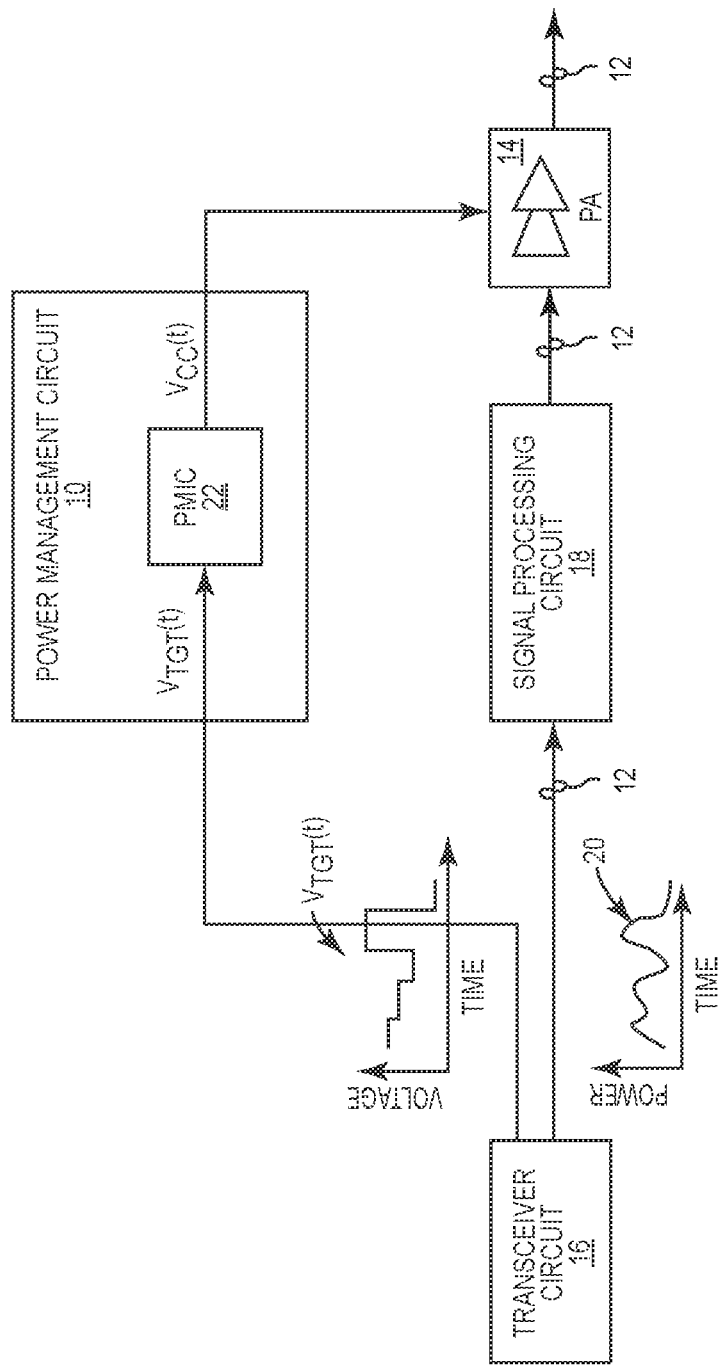
FIG. 1A is a schematic diagram of an exemplary existing power management circuit that may cause amplitude distortion in an analog signal.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include a delay-compensating power management circuit. The power management circuit includes a power management integrated circuit (PMIC) configured to generate a time-variant voltage(s) based on a time-variant target voltage(s) for amplifying an analog signal(s) associated with a time-variant power envelope(s). A voltage processing circuit is provided in the power management circuit to determine a temporal offset, which can be positive or negative, between the time-variant power envelope(s) and the time-variant target voltage(s). Accordingly, the voltage processing circuit modifies the time-variant target voltage(s) to substantially reduce the determined temporal offset and thereby realign the time-variant target voltage(s) with the time-variant power envelope(s). By realigning the time variant target voltage(s) with the time-variant power envelope(s), it is possible to align the time-variant voltage(s) with the time-variant power envelope(s) to reduce distortions (e.g., amplitude clipping) during amplification of the analog signal.

Figure 1B:
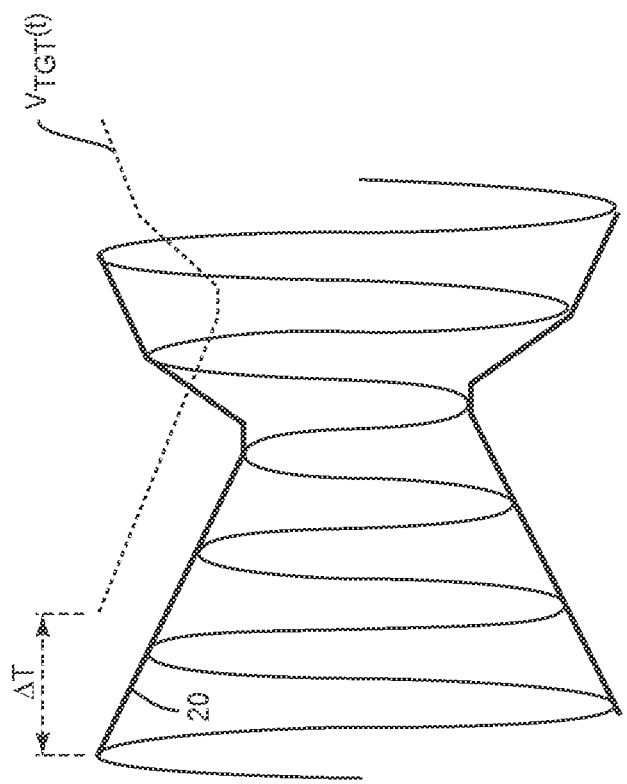
FIG. 1B is a graphic diagram providing an exemplary illustration of a positive temporal offset between a time-variant power envelope of the analog signal and a time-variant target voltage that may occur in the existing power management circuit of FIG. 1A.
Figure 1C:
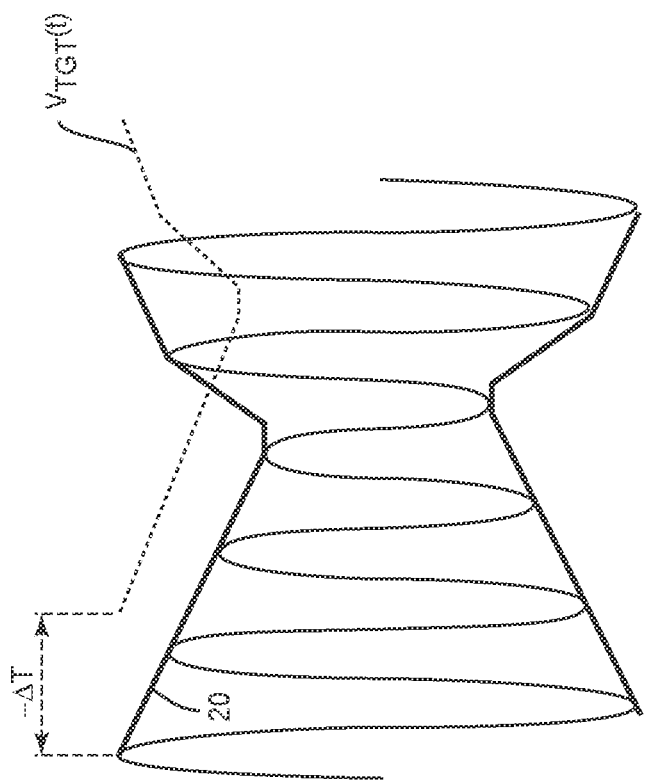
FIG. 1C is a graphic diagram providing an exemplary illustration of a negative temporal offset between a time-variant power envelope of the analog signal and a time-variant target voltage that may occur in the existing power management circuit of FIG. 1A.
Figure 1D:
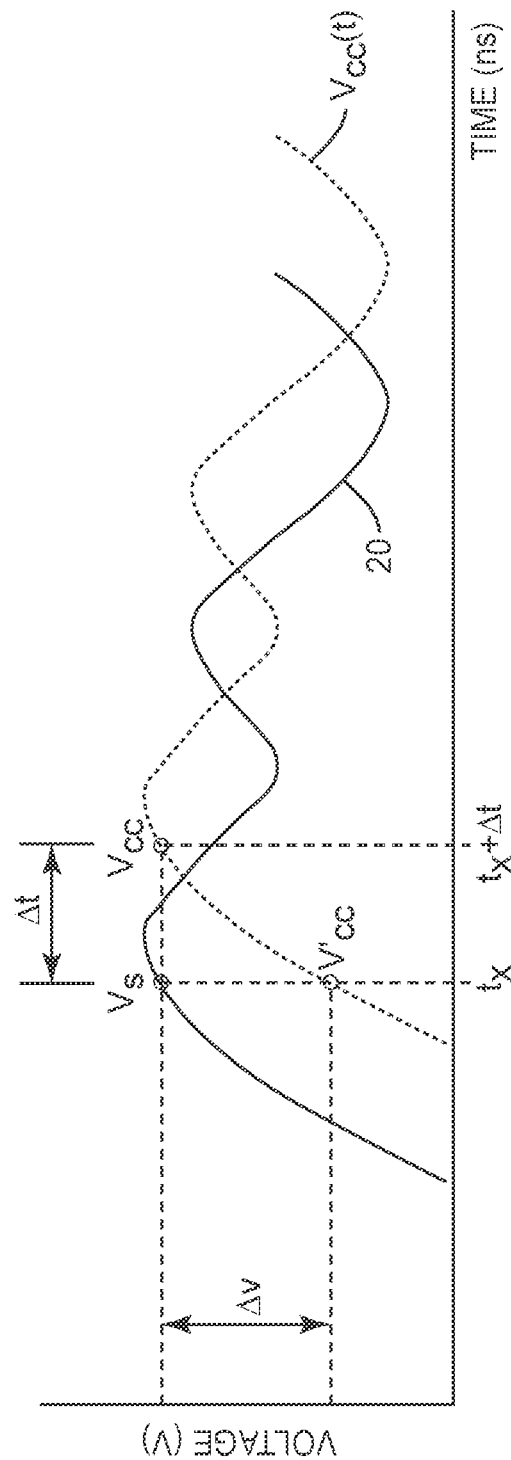
FIG. 1D is a graphic diagram providing an exemplary illustration as to how the positive temporal offset in FIG. 1B can cause amplitude distortion to the analog signal in FIG. 1A.
Figure 2:
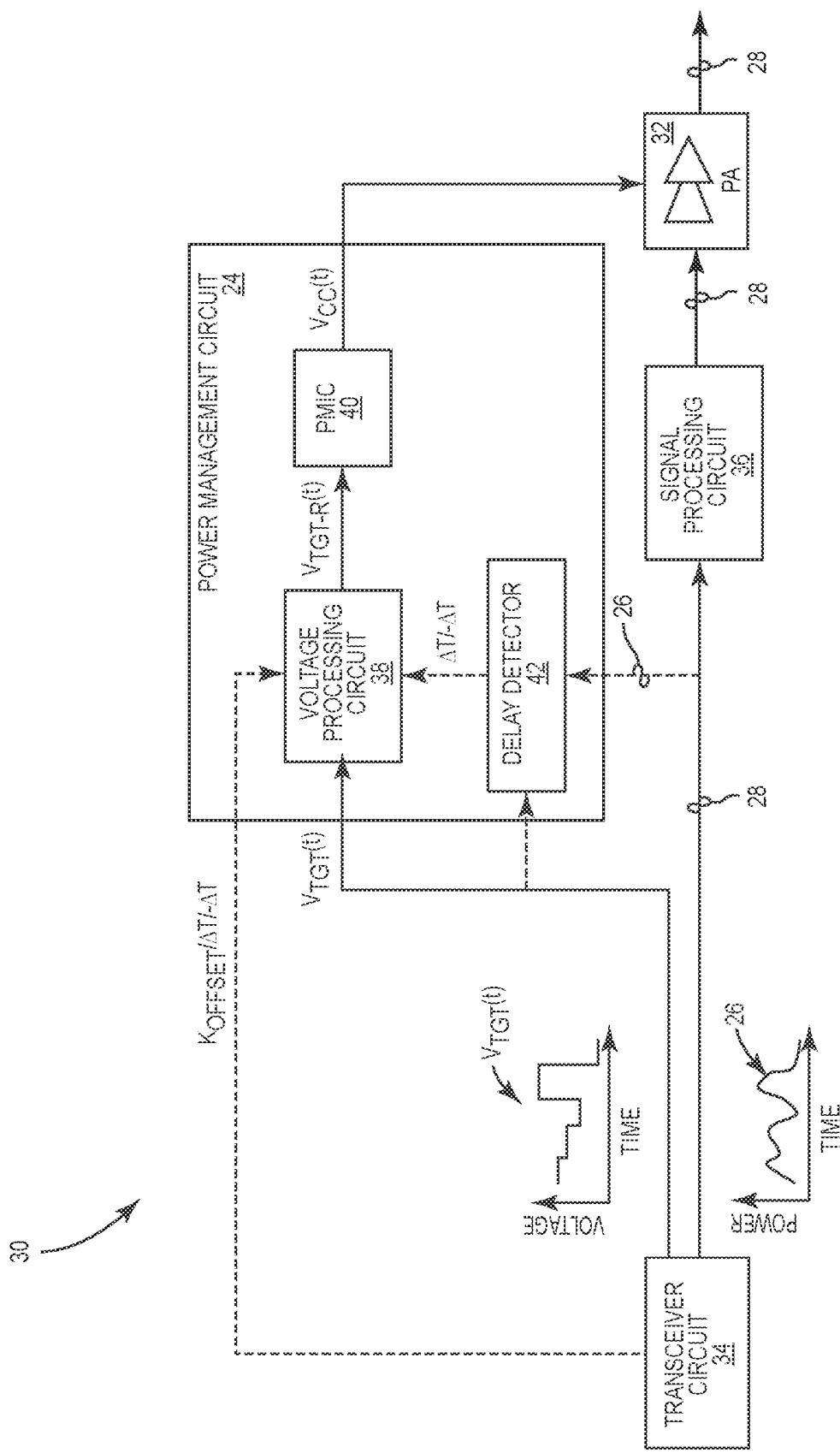
FIG. 2 is a schematic diagram of an exemplary power management circuit configured according to embodiments of the present disclosure to realign a time-variant target voltage with a time-variant power envelope of an analog signal.

Before discussing a power management circuit of the present disclosure, starting at FIG. 2, a brief overview of an existing power management circuit that may cause amplitude distortion in an analog signal as a result of misalignment between a time-variant target voltage and a time-variant power envelope of the analog signal is first provided with reference to FIGS. 1A-1D.

FIG. 1A is a schematic diagram of an exemplary existing power management circuit 10 that that may cause amplitude distortion in an analog signal 12. The existing power management circuit 10 is configured to provide a time-variant voltage $V_{CC}(t)$ to a power amplifier 14 for amplifying the analog signal 12. The analog signal 12 may be generated by a transceiver circuit 16 and provided to a signal processing circuit 18 in an intermediate frequency (IF). The signal processing circuit 18 may upconvert the analog signal 12 from the IF to a carrier frequency and provide the analog signal 12 to the power amplifier 14 for amplification.

The analog signal 12 is associated with a time-variant power envelope that rises and falls over time. Thus, to prevent potential amplitude distortion in the analog signal 12 and ensure higher operating efficiency of the power amplifier 14, it is necessary for the existing power management circuit 10 to generate the time-variant voltage $V_{CC}(t)$ to closely track the time-variant power envelope 20. In other words, the time-variant voltage $V_{CC}(t)$ needs to be time aligned with the time-variant power envelope 20 as closely as possible. Herein, a signal is said to be time aligned with another signal when a time difference between the two signals is neglectable (e.g., <±1 μs).

As such, the transceiver circuit 16 is configured to generate a time-variant target voltage $V_{TGT}(t)$ that is time aligned with the time-variant power envelope 20 of the analog signal 12. The transceiver circuit 16 then provides the time-variant target voltage $V_{TGT}(t)$ and the analog signal 12 substantially concurrently to the existing power management circuit 10 and the signal processing circuit 18, respectively. Accordingly, a power management integrated circuit (PMIC) 22 can generate the time-variant voltage $V_{CC}(t)$ based on the time-variant target voltage $V_{TGT}(t)$. In this regard, if the time-variant target voltage $V_{TGT}(t)$ is time aligned with the time-variant power envelope 20, then the time-variant voltage $V_{CC}(t)$ is expected to be time aligned with the time-variant power envelope 20 as well.

However, a variety of factors may cause the time-variant target voltage $V_{TGT}(t)$ to become misaligned from the time-variant power envelope 20 when the time-variant target voltage $V_{TGT}(t)$ arrives at the PMIC 22, even if the transceiver circuit 16 communicates the time-variant target voltage $V_{TGT}(t)$ and the analog signal 12 substantially concurrently. For example, the transceiver circuit 16 may communicate the time-variant target voltage $V_{TGT}(t)$ via a serial bus, such as a radio frequency front-end (RFFE) bus, and communicate the analog signal 12 via a parallel bus, such as a general-purpose input/output (GPIO) bus, or vice versa. The difference in bus speeds may cause the time-variant target voltage $V_{TGT}(t)$ to fall behind or lead the time-variant power envelope 20 at the PMIC 22.

In one example, as shown in FIG. 1B, the time-variant target voltage $V_{TGT}(t)$ can lag behind the time-variant power envelope 20 by a positive temporal offset ΔT when the time-variant target voltage $V_{TGT}(t)$ arrives at the PMIC 22. In this regard, FIG. 1B is a graphic diagram providing an exemplary illustration of a positive temporal delay ΔT between the time-variant power envelope 20 of the analog signal 12 and the time-variant target voltage $V_{TGT}(t)$ that may occur in the existing power management circuit 10 of FIG. 1A. As such, to realign the time-variant target voltage $V_{TGT}(t)$ with the time-variant power envelope 20, it is necessary to delay the time-variant power envelope 20 and/or time-advance the time-variant target voltage $V_{TGT}(t)$ to eliminate the positive temporal offset ΔT between the time-variant power envelope 20 and the time-variant target voltage $V_{TGT}(t)$.

In another example, as shown in FIG. 1C, the time-variant target voltage $V_{TGT}(t)$ can lead the time-variant power envelope 20 when the time-variant target voltage $V_{TGT}(t)$ arrives at the PMIC 22. In other words, the time-variant target voltage $V_{TGT}(t)$ can be said to lag behind the time-variant power envelope 20 by a negative temporal offset −ΔT.

In this regard, FIG. 1C is a graphic diagram providing an exemplary illustration of a negative temporal delay −ΔT between the time-variant power envelope 20 of the analog signal 12 and the time-variant target voltage $V_{TGT}(t)$ that may occur in the existing power management circuit 10 of FIG. 1A. As such, to realign the time-variant target voltage $V_{TGT}(t)$ with the time-variant power envelope 20, it is necessary to delay the time-variant target voltage $V_{TGT}(t)$ and/or time-advance the time-variant power envelope 20 to eliminate the negative temporal offset −ΔT between the time-variant power envelope 20 and the time-variant target voltage $V_{TGT}(t)$.

As a result of the misalignment between the time-variant target voltage $V_{TGT}(t)$ and the time-variant power envelope 20, the time-variant voltage $V_{CC}(t)$ is likely misaligned from the time-variant power envelope 20 at the power amplifier 14. As illustrated in FIG. 1D, the misalignment between the time-variant voltage $V_{CC}(t)$ and the time-variant power envelope 20 can cause amplitude distortion in the analog signal 12.

In this regard, FIG. 1D is a graphic diagram providing an exemplary illustration as to how the positive temporal offset ΔT in FIG. 1B can cause amplitude distortion to the analog signal 12 in FIG. 1A.

If the time-variant power envelope 20 and the time-variant voltage $V_{CC}(t)$ are perfectly aligned, an instantaneous amplitude of the analog signal 12 (not shown), which is represented by a voltage $V_S$, would substantially equal the time-variant voltage $V_{CC}(t)$ at time $t_x$. However, as shown in FIG. 1C, the time-variant voltage $V_{CC}(t)$ lags behind the time-variant power envelope 20 by a temporal delay Δt. As such, at time $t_x$, the power amplifier 14 (not shown) receives a lower voltage $V'_{CC}$, instead of the time-variant voltage $V_{CC}(t)$. In this regard, the time-variant voltage $V_{CC}(t)$ deviates from the time-variant power envelope 20 by a voltage differential Δv at time $t_x$. Consequently, the power amplifier 14 may clip the analog signal 12 to cause an amplitude distortion.

Although FIG. 1D illustrates the amplitude distortion resulted from the time-variant target voltage $V_{TGT}(t)$ lagging behind the time-variant power envelope 20 by the positive temporal offset ΔT, it should be understood that such amplitude distortion may also be caused by the time-variant target voltage $V_{TGT}(t)$ lagging behind the time-variant power envelope 20 by the negative temporal offset −ΔT. As such, it is desirable to reduce the positive temporal offset ΔT and/or the negative temporal offset −ΔT between the time-variant target voltage $V_{TGT}(t)$ and the time-variant power envelope 20 to help align the time-variant voltage $V_{CC}(t)$ with the time-variant power envelope 20 at the power amplifier 14.

In this regard, FIG. 2 is a schematic diagram of an exemplary power management circuit 24 configured according to embodiments of the present disclosure to realign a time-variant target voltage $V_{TGT}(t)$ with a time-variant power envelope 26 of an analog signal 28. In a non-limiting example, the power management circuit 24 can be provided in a power management apparatus 30 that further includes a power amplifier 32, a transceiver circuit 34, and a signal processing circuit 36.

The power management circuit 24 is configured to provide a time-variant voltage $V_{CC}(t)$ to the power amplifier 32 for amplifying the analog signal 28. The analog signal 28 may be generated by the transceiver circuit 34 and provided to the signal processing circuit 36 in IF. The signal processing circuit 36 may upconvert the analog signal 28 from the IF to a carrier frequency and provide the analog signal 28 to the power amplifier 32 for amplification. The analog signal 28 is associated with the time-variant power envelope 26 that rises and falls over time. Thus, to prevent potential amplitude distortion in the analog signal 28 and ensure higher operating efficiency of the power amplifier 32, it is necessary to generate the time-variant voltage $V_{CC}(t)$ to closely track the time-variant power envelope 26.

In this regard, the power management circuit 24 is configured to include a voltage processing circuit 38 and a PMIC 40. The voltage processing circuit 38, which can be a field-programmable gate array (FPGA) as an example, is configured to receive the time-variant target voltage $V_{TGT}(t)$ from the transceiver circuit 34. As previously discussed in FIGS. 1B and 1C, the time-variant target voltage $V_{TGT}(t)$ may lag behind the time-variant power envelope 26 by a positive temporal offset ΔT or a negative temporal offset −ΔT. As discussed in detail below, the voltage processing circuit 38 is configured to determine the positive temporal offset ΔT and/or the negative temporal offset −ΔT between the time-variant power envelope 26 and the time-variant target voltage $V_{TGT}(t)$. Accordingly, the voltage processing circuit 38 can generate a time-variant modified target voltage $V_{TGT-R}(t)$ that is time-adjusted relative to the time-variant power envelope 26 to thereby substantially reduce the determined positive temporal offset ΔT and/or the negative temporal offset −ΔT. Herein, a first signal is said to be time-adjusted relative to a second signal when the first signal is moved forward or backward in time to eliminate the positive temporal offset ΔT or the negative temporal offset −ΔT from the second signal.

By substantially reducing the determined positive temporal offset ΔT and/or the negative temporal offset −ΔT, it is possible to realign the time-variant modified target voltage $V_{TGT-R}(t)$ with the time-variant power envelope 26. As a result, it is possible to keep the time-variant voltage $V_{CC}(t)$ aligned with the time-variant power envelope 26, thus helping to prevent amplitude distortion to the analog signal 28 at the power amplifier 32.

Figure 3:
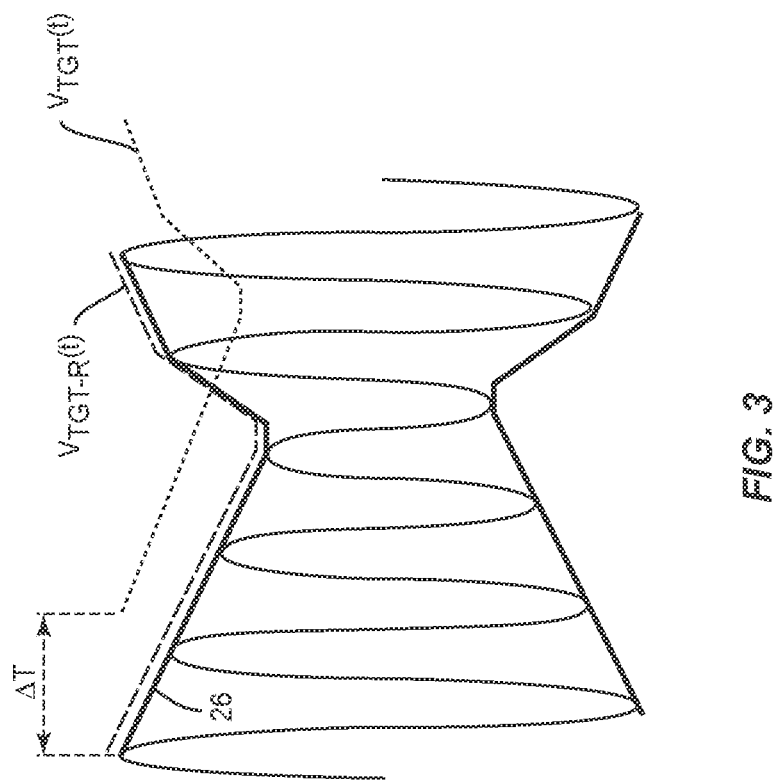
FIG. 3 is a graphic diagram providing an exemplary illustration of a modified target voltage that is time-adjusted relative to the time-variant power envelope in FIG. 2 to substantially reduce a positive temporal offset between the time-variant target voltage and the time-variant power envelope.

FIG. 3 is a graphic diagram providing an exemplary illustration of the modified target voltage $V_{TGT-R}(t)$ that is time-adjusted relative to the time-variant power envelope 26 in FIG. 2 to substantially reduce the positive temporal offset ΔT between the time-variant target voltage $V_{TGT}(t)$ and the time-variant power envelope 26. Common elements between FIGS. 2 and 3 are shown therein with common element numbers and will not be re-described herein.

As shown in FIG. 3, the target voltage $V_{TGT}(t)$ as originally received from the transceiver circuit 34 lags behind the time-variant power envelope 26 by the positive temporal ΔT. In contrast, the modified target voltage $V_{TGT-R}(t)$ is time-adjusted to substantially reduce the positive temporal offset ΔT to thereby be better aligned with the time-variant power envelope 26. Herein, the modified target voltage $V_{TGT-R}(t)$ is said to substantially reduce the positive temporal offset ΔT when a temporal gap ΔT between the modified target voltage $V_{TGT-R}(t)$ and the time-variant power envelope 26 is less than 10% of the positive temporal delay ΔT. As a result of improved alignment with the time-variant power envelope 26, it is possible to reduce or even avoid amplitude distortion at the power amplifier 32.

With reference back to FIG. 2, in one embodiment, the positive temporal offset ΔT and/or the negative temporal offset −ΔT can be determined by the transceiver circuit 34 and provided to the voltage processing circuit 38. The transceiver circuit 34 may provide the positive temporal offset ΔT and/or the negative temporal offset −ΔT periodically (e.g., per symbol, mini slot, or slot).

In another embodiment, the power management circuit 24 can be configured to further include a delay detector circuit 42. The delay detector circuit 42 can be configured to dynamically detect the positive temporal offset ΔT or the negative temporal offset −ΔT between the time-variant power envelope 26 and the time-variant target voltage $V_{TGT}(t)$ and provide the detected positive temporal offset ΔT or the detected negative temporal offset −ΔT to the voltage processing circuit 38. The delay detector circuit 42 may detect the positive temporal offset ΔT and/or the negative temporal offset −ΔT periodically (e.g., per symbol, mini slot, or slot).

The voltage processing circuit 38 can be configured to generate the modified target voltage $V_{TGT-R}(t)$ from the time-variant target voltage $V_{TGT}(t)$ and as a function of a modulated modifier $K_{MOD}(t)$. In a non-limiting example, the modified target voltage $V_{TGT-R}(t)$ can be described by the equation (Eq. 1) below.

$$V_{TGT-R}(t)=V_{TGT}(t)+K_{MOD}(t)*(V_{TGTMAX}-V_{TGT}(t)) \quad \text{(Eq. 1)}$$

In the equation (Eq. 1) above, $K_{MOD}(t)$ represents the modulated modifier and $V_{TGTMAX}$ represents an estimated maximum value of the time-variant target voltage $V_{TGT}(t)$. The voltage processing circuit 38 can be configured to generate the modulated modifier $K_{MOD}(t)$ as a function of a linear term $K_{MODLINEAR}(t)$ and a nonlinear term $NL_{GAIN}(dV_{TGT}(t)/dt)$. In a non-limiting example, the modulated modifier $K_{MOD}(t)$ can be described by the equation (Eq. 2) below.

$$K_{MOD}(t)=K_{MODLINEAR}(t)*NL_{GAIN}(dV_{TGT}(t)/dt) \quad \text{(Eq. 2)}$$

The voltage processing circuit 38 can be configured to determine the linear term $K_{MODLINEAR}(t)$ as a function of a delay budget dT and a voltage offset $K_{OFFSET}(dT)$ corresponding to the delay budget dT. In this regard, to realign the time-variant target voltage $V_{TGT}(t)$ with the time-variant power envelope 26, the delay budget dT may be equal to the positive temporal offset ΔT (dT=ΔT) if the time-variant target voltage $V_{TGT}(t)$ lags behind the time-variant power envelope 26, or be equal to the negative temporal offset −ΔT (dT=−ΔT) if the time-variant target voltage $V_{TGT}(t)$ leads the time-variant power envelope 26. In this regard, the delay budget dT can be positive or negative. In a non-limiting example, the linear term $K_{MODLINEAR}(t)$ can be described by the equation (Eq. 3) below.

$$K_{MODLINEAR}(t)=K_{OFFSET}(dT)+[dV_{TGT}(t)/dt]*dT/[V_{TGTMAX}-V_{TGT}(t)] \quad \text{(Eq. 3)}$$

In one embodiment, the delay budget dT and the voltage offset $K_{OFFSET}(dT)$ corresponding to the delay budget dT can be predetermined and stored in the voltage processing circuit 38. As shown in FIG. 4, the voltage offset $K_{OFFSET}(dT)$ may be so determined to provide a voltage headroom ΔV between peaks of the modified target voltage $V_{TGT-R}(t)$ and peaks of the time-variant power envelope 26 of the analog signal 28. FIG. 4 is a graphic diagram providing an exemplary illustration of the voltage headroom ΔV as created by the voltage offset $K_{OFFSET}(dT)$ in the equation (Eq. 3).

Notably, the time-variant power envelope 26 can have a number of amplitude peaks 44 and the time-variant modified target voltage $V_{TGT-R}(t)$ can have a number of voltage peaks 46 each corresponding to a respective one of the amplitude peaks 44. In this regard, the voltage offset $K_{OFFSET}(dT)$ is determined to cause each of the voltage peaks 46 to be higher than the respective one of the amplitude peaks 44 by the voltage headroom $\Delta V$. By creating the voltage headroom $\Delta V$ between the time-variant modified target voltage $V_{TGT\text{-}R}(t)$ and the time-variant power envelope 26, it is possible to ensure that the PMIC 40 can always generate the time-variant voltage $V_{CC}(t)$ sufficient enough to avoid amplitude distortion in the analog signal 28.

With reference back to FIG. 2, the nonlinear term $NL_{GAIN}(dV_{TGT}(t)/dt)$ is introduced in the equation (Eq. 2) to ensure that the voltage headroom $\Delta V$ created by the voltage offset $K_{OFFSET}(dT)$ in the linear term $K_{MODLINEAR}(t)$ is not excessively high to cause linearity degradation in the power amplifier 32. In a non-limiting example, the nonlinear term $NL_{GAIN}(dV_{TGT}(t)/dt)$ is a function that is equal to one (1) for most $dV_{TGT}(t)/dt$ or less than 1 when $dV_{TGT}(t)/dt$ approaches a maximum or a minimum. As a result, the voltage headroom $\Delta V$ can be maintained when the nonlinear term $NL_{GAIN}(dV_{TGT}(t)/dt)$ is equal to 1 or reduced when the nonlinear term $NL_{GAIN}(dV_{TGT}(t)/dt)$ is less than 1.

Simulations have shown that the time-variant modified target voltage $V_{TGT\text{-}R}(t)$ generated based on the equations (Eq. 1 to 3) can have a very similar waveform as the time-variant target voltage $V_{TGT}(t)$ for different delay budgets dT, despite being time-adjusted. This means that the time-variant modified target voltage $V_{TGT\text{-}R}(t)$ can reduce the positive temporal offset $\Delta T$ and the negative temporal offset $-\Delta T$ without much deviation and distortion from the time-variant target voltage $V_{TGT}(t)$. In this regard, the embodiments disclosed in the present disclosure are advantageous over the use of a traditional low-pass filter to create a group delay in that the low-pass filter may generate group delay ripple within modulation bandwidth and may be difficult to implement for reducing a larger group delay.

Those skilled in the art will recognize improvements and modifications to the embodiments of the present disclosure. All such improvements and modifications are considered within the scope of the concepts disclosed herein and the claims that follow.

What is claimed is:

1. A method for compensating a delay in a power management circuit comprising:
   determining a temporal offset between a time-variant power envelope of an analog signal and a time-variant target voltage corresponding to the time-variant power envelope;
   generating a time-variant modified target voltage that is time-adjusted relative to the time-variant power envelope to thereby substantially reduce the determined temporal offset between the time-variant target voltage and the time-variant power envelope; and
   generating a time-variant voltage based on the time-variant modified target voltage for amplifying the analog signal.

2. The method of claim 1, wherein:
   determining the temporal offset comprises determining the temporal offset using a voltage processing circuit;
   generating the time-variant modified target voltage comprises generating the time-variant modified target voltage using the voltage processing circuit; and
   generating the time-variant voltage comprises generating the time-variant voltage using a power management integrated circuit (PMIC).

3. The method of claim 1, further comprising:
   delaying the time-variant target voltage from the time-variant power envelope by the temporal offset;
   determining a positive temporal offset between the time-variant power envelope and the time-variant target voltage; and
   generating the time-variant modified target voltage based on the determined positive temporal offset to time-advance the time-variant target voltage to thereby substantially reduce the determined positive temporal offset.

4. The method of claim 1, further comprising:
   delaying the time-variant power envelope from the time-variant target voltage by the temporal offset;
   determining a negative temporal offset between the time-variant power envelope and the time-variant target voltage; and
   generating the time-variant modified target voltage based on the determined negative temporal offset to time-delay the time-variant target voltage to thereby substantially reduce the determined negative temporal offset.

5. The method of claim 1, further comprising receiving the time-variant target voltage from a transceiver circuit via a communication bus.

6. The method of claim 5, further comprising receiving the temporal offset from the transceiver circuit.

7. The method of claim 1, further comprising receiving the time-variant target voltage and the time-variant power envelope from a transceiver circuit via a communication bus.

8. The method of claim 6, further comprising dynamically determining the temporal offset between the time-variant target voltage and the time-variant power envelope.

9. The method of claim 8, wherein dynamically determining the temporal offset comprises dynamically determining the temporal offset using a delay detector circuit.

10. The method of claim 1, further comprising generating the time-variant modified target voltage as a function of a modulated modifier.

11. The method of claim 10, further comprising generating the time-variant modified target voltage based on an equation expressed as:

$$V_{TGT\text{-}R}(t)=V_{TGT}(t)+K_{MOD}(t)*(V_{TGTMAX}-V_{TGT}(t));$$

wherein:
   $V_{TGT\text{-}R}(t)$ represents the time-variant modified target voltage;
   $V_{TGT}(t)$ represents the received time-variant target voltage;
   $K_{MOD}(t)$ represents the modulated modifier; and
   $V_{TGTMAX}$ represents an estimated maximum value of the received time-variant target voltage $V_{TGT}(t)$.

12. The method of claim 10, further comprising determining the modulated modifier as a function of a linear term and a nonlinear term.

13. The method of claim 12, further comprising determining the modulated modifier based on an equation expressed as:

$$K_{MOD}(t)=K_{MODLINEAR}(t)*NL_{GAIN}(dV_{TGT}(t)/dt);$$

wherein:
   $K_{MOD}(t)$ represents the modulated modifier;
   $K_{MODLINEAR}(t)$ represents the linear term; and
   $NL_{GAIN}(dV_{TGT}(t)/dt)$ represents the nonlinear term.

14. The method of claim 12, further comprising determining the linear term as a function of a voltage offset corresponding to the temporal offset.

15. The method of claim 14, further comprising predetermining that the voltage offset is based on the temporal offset and stored in a voltage processing circuit.

16. The method of claim 15, further comprising determining the linear term based on an equation expressed as:

$$K_{MODLINEAR}(t) = K_{OFFSET}(dT) + [dV_{TGT}(t)/dt] * dT / [V_{TGTMAX} - V_{TGT}(t)];$$

wherein:
$K_{MODLINEAR}(t)$ represents the linear term;
dT represents the temporal offset;
$K_{OFFSET}(dT)$ represents the voltage offset corresponding to the temporal offset;
$V_{TGT}(t)$ represents the received time-variant target voltage; and
$V_{TGTMAX}$ represents an estimated maximum value of the received time-variant target voltage $V_{TGT}(t)$.

17. The method of claim 14, wherein:
the time-variant power envelope of the analog signal comprises a plurality of amplitude peaks;
the time-variant modified target voltage comprises a plurality of voltage peaks each corresponding to a respective one of the plurality of amplitude peaks; and
the voltage offset is selected to cause each of the plurality of voltage peaks to be higher than the respective one of the plurality of amplitude peaks.

18. The method of claim 1, further comprising amplifying the analog signal based on the time-variant voltage.

19. A wireless device comprising:
a transceiver circuit configured to generate a time-variant power envelope of an analog signal and a time-variant target voltage corresponding to the time-variant power envelope;
a power management circuit comprising:
a voltage processing circuit configured to:
determine a temporal offset between the time-variant power envelope and the time-variant target voltage; and
generate a time-variant modified target voltage that is time-adjusted relative to the time-variant power envelope to thereby substantially reduce the determined temporal offset between the time-variant target voltage and the time-variant power envelope; and
a power management integrated circuit (PMIC) configured to generate a time-variant voltage based on the time-variant modified target voltage; and
a power amplifier configured to amplify the analog signal based on the time-variant voltage.

20. The wireless device of claim 19 wherein the voltage processing circuit is further configured to receive the time-variant target voltage and the temporal offset from the transceiver circuit.

* * * * *